United States Patent
Park

(10) Patent No.: US 12,073,556 B2
(45) Date of Patent: Aug. 27, 2024

(54) DEFECT INSPECTION SYSTEM AND SEMICONDUCTOR FABRICATION APPARATUS INCLUDING A DEFECT INSPECTION APPARATUS USING THE SAME

(71) Applicant: SK hynix Inc., Gyeonggi-do (KR)

(72) Inventor: Jeong Ok Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 179 days.

(21) Appl. No.: 17/722,031

(22) Filed: Apr. 15, 2022

(65) Prior Publication Data
US 2023/0134909 A1 May 4, 2023

(30) Foreign Application Priority Data
Nov. 4, 2021  (KR) .................... 10-2021-0150810

(51) Int. Cl.
*G06T 7/00* (2017.01)
*G01N 21/95* (2006.01)
*H01L 21/67* (2006.01)

(52) U.S. Cl.
CPC ......... *G06T 7/001* (2013.01); *G01N 21/9501* (2013.01); *H01L 21/67196* (2013.01); *H01L 21/67288* (2013.01); *G01N 2201/0634* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 8,947,521 B1 * | 2/2015 | Hill ........................ | H04N 23/69 |
| | | | 382/145 |
| 9,553,034 B1 * | 1/2017 | Young ..................... | H01L 22/12 |
| 10,338,002 B1 * | 7/2019 | Danen ................ | G01N 21/9505 |
| 11,494,895 B2 * | 11/2022 | Nie ..................... | G01N 21/9501 |
| 2009/0033924 A1 * | 2/2009 | Uto ......................... | G01N 21/00 |
| | | | 356/237.2 |
| 2009/0213215 A1 * | 8/2009 | Shibata .............. | G01N 21/9501 |
| | | | 382/141 |
| 2013/0336574 A1 * | 12/2013 | Nasser-Ghodsi ....... | G06T 7/001 |
| | | | 382/145 |
| 2013/0343632 A1 * | 12/2013 | Urano ..................... | G06T 7/001 |
| | | | 382/149 |
| 2017/0295355 A1 * | 10/2017 | Tanaka .................. | H04N 13/128 |
| 2019/0073566 A1 * | 3/2019 | Brauer ................. | G06V 10/776 |

(Continued)

FOREIGN PATENT DOCUMENTS

| | | |
|---|---|---|
| KR | 10-2006-0025834 A | 3/2006 |
| KR | 10-1606093 B1 | 3/2016 |
| KR | 10-2098086 B1 | 4/2020 |

*Primary Examiner* — Sath V Perungavoor
*Assistant Examiner* — Paramita Ghosh
(74) *Attorney, Agent, or Firm* — IP & T GROUP LLP

(57) ABSTRACT

A defect inspection system may include an information-obtaining module and a defect inspection module. The information obtaining module may be arranged over a transferring apparatus to continuously photograph a surface of a substrate transferred by the transferring apparatus. The defect inspection module may generate an image signal based on information of the substrate provided from the information-obtaining module. The defect inspection module may compare the image signal with a reference to detect a defect of the substrate.

17 Claims, 6 Drawing Sheets

(56) References Cited

U.S. PATENT DOCUMENTS

2020/0064276 A1* 2/2020 Lee ........................... G06T 5/50
2022/0016786 A1* 1/2022 Hatano ................ B25J 19/0054
2022/0068681 A1* 3/2022 Han ....................... G01N 21/41

* cited by examiner

DEFECT INSPECTION SYSTEM AND SEMICONDUCTOR FABRICATION APPARATUS INCLUDING A DEFECT INSPECTION APPARATUS USING THE SAME

CROSS-REFERENCES TO RELATED APPLICATION

The present application claims priority under 35 U.S.C. § 119(a) to Korean patent application number 10-2021-0150810, filed on Nov. 4, 2021, in the Korean Intellectual Property Office, which is incorporated herein by reference in its entirety.

BACKGROUND

1. Technical Field

Various embodiments generally relate to a semiconductor fabrication technology, more particularly, to a defect inspection system and a semiconductor fabrication apparatus including a defect inspection apparatus using the same.

2. Related Art

Generally, during performing semiconductor fabrication processes, various defects such as an organic contaminant, a metal impurity, a scratch, a crack, a chipping, a breakage, etc., may be generated at a semiconductor substrate. The defects may be inspected by using a macro inspection or an in-line automatic optical inspection after performing each of the semiconductor fabrication processes.

SUMMARY

According to example embodiments, there is provided a defect inspection system. The defect inspection system may include an information-obtaining module and a defect inspection module. The information obtaining module may be arranged over a transferring apparatus to continuously photograph a surface of a substrate transferred by the transferring apparatus. The defect inspection module may generate an image signal based on information of the substrate provided from the information-obtaining module. The defect inspection module may compare the image signal with a reference to detect a defect of the substrate.

In example embodiments, the information-obtaining module may include a light source and an optical detector. The light source may be configured to irradiate an incident light to the substrate. The optical detector may collect a reflected light from the substrate to generate an electrical signal with respect to the reflected light.

In example embodiments, the information-obtaining module may further include an optical path changer. The optical path changer may be arranged between the substrate and the optical detector to change an optical path of the reflected light toward the detector.

In example embodiments, the light source may control an incident angle of the incident light based on a position of the defect on the substrate.

In example embodiments, the light source may include a plurality of sub-light sources. At least one of wavelengths, incident lights and lighting times of the sub-light sources may be different from each other. Further, the sub-light sources may irradiate the incident light to different substrates.

In example embodiments, the defect inspection module may include an image signal generator, a storage and a defect determining member. The image signal generator may generate the image signal using the information of the substrate provided from the information-obtaining module. The storage may store information of a normal substrate and information of a defect in a previous substrate as a reference. The defect determining member may compare the image signal with the reference to generate a defect detection signal.

According to example embodiments, there may be provided a semiconductor fabrication apparatus. The semiconductor fabrication apparatus may include first and second process chamber, a load-lock chamber and a transfer chamber. The load-lock chamber may be configured to receive a plurality of substrate to be loaded into the first process chamber or the second process chamber. The transfer chamber may be arranged between the first process chamber, the second process chamber and the load-lock chamber to transfer the substrates to the first process chamber, the second process chamber or the load-lock chamber.

In example embodiments, the semiconductor fabrication apparatus may further include a defect inspection apparatus arranged in the transfer chamber. The defect inspection apparatus may detect a defect of the substrate transferred in the transfer chamber based on an image signal of the substrate.

In example embodiments, the defect inspection apparatus may include a continuous photographer configured to continuously photograph at least a portion of the substrate. The continuous photographer may accumulate photographed signals to output a continuous image signal.

In example embodiments, the defect inspection apparatus may further include an illuminator configured to provide the continuous photographer with an illumination light.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
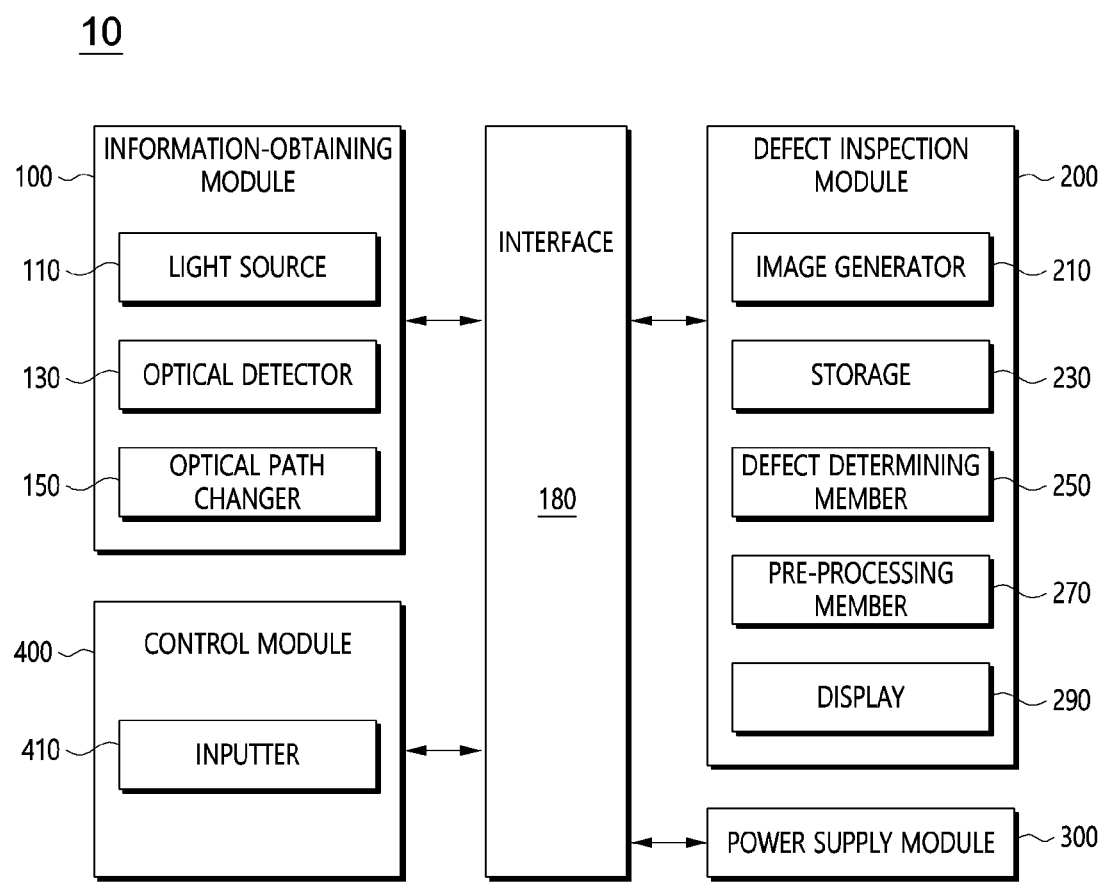
FIG. 1 is a view illustrating a defect inspection system in accordance with example embodiments.
Figure 2:
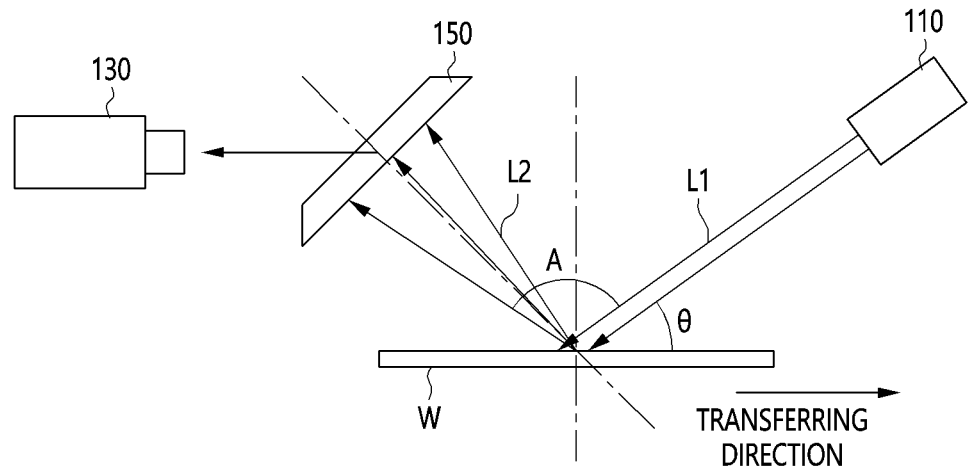
FIG. 2 is a view illustrating a method of inspecting a defect in accordance with example embodiments.

FIG. 1 is a view illustrating a defect inspection system in accordance with example embodiments and FIG. 2 is a view illustrating a method of inspecting a defect in accordance with example embodiments.

Referring to FIGS. 1 and 2, a defect inspection system 10 of example embodiments may detect a defect of a substrate in real time. The defect inspection system 10 may include an information-obtaining module 100, an interface 180, a defect inspection module 200, a power supply module 300 and a control module 400.

The information-obtaining module 100 may include a light source 110, an optical detector 130 and an optical path changer 150.

The light source 110 may irradiate an incident light L1 to a surface of the substrate W. In example embodiments, the substrate W may include a bare wafer, a wafer with at least one layer, etc. The incident light L1 may be incident to the surface of the substrate W at an angle θ. The incident light L1 may then be reflected from the surface of the substrate W. A reference numeral L2 may indicate the reflected light from the surface of the substrate W. For example, the light source 110 may be arranged at a semiconductor fabrication apparatus positioned on a transferring direction of the substrate W, or a semiconductor fabrication apparatus configured to perform the following process.

The light source 110 may include a light source including a scanning type, a light emitting diode (LED), a mixed light source including a plurality of beams having different characteristics, and a combination thereof.

For example, when the incident light L1 may have a line shape or a stripe shape, the incident light L1 may be focused on an inspection region of the substrate W. Thus, unnecessary noises may be reduced in an inspection process.

The light source 110 may irradiate the incident light L1 using a scanning tech. The incident light L1 irradiated by the light source 110 may have at least one wavelength. For example, wavelengths of the incident light L1 may be selected based on properties of the surface of the substrate W, for example, properties of the inspection region of the substrate W. In order to generate the incident light L1 having multi-wavelengths, the light source 110 may include a plurality of sub-light sources. The sub-light sources may be selectively or simultaneously driven. For example, when the inspection region may include a metal layer formed on the substrate W, the light source 110 may irradiate the incident light L1 having a wavelength of about 680 nm to about 780 nm. When the inspection region may include a silicon nitride layer, the light source 110 may irradiate the incident light L1 having a wavelength of about 480 nm to about 580 nm. When the inspection region may include a silicon oxide layer, the light source 110 may irradiate the incident light L1 having a wavelength of about 380 nm to about 480 nm. For example, an optimal sub-light source among the sub-light sources may be selected in accordance with the kinds and thicknesses of the inspection region. The selected sub-light source may irradiate the incident light L1.

The light source 110 may include a white light source, a blue light source and a yellow light source. Any one of the white light source, the blue light source and the yellow light source may be selected in accordance with a previous process which is performed immediately prior to this defect inspection process. For example, when the previous process includes a photolithography process, the yellow light source may be selected. When the previous process includes a diffusion process, the blue light source may be selected. However, the light source 110 having various wavelengths and various colors may be selected without the above-mentioned conditions.

The light source 110 may control an incident angle of the incident light L1 with respect to the surface of the substrate W from about 0 to about 90°. The light source 110 may include a plurality of sub-light sources, and the incident lights emitted from the sub-light sources may have same or different incident angles.

The light source 110 may irradiate the incident light L1 to the successively transferred substrates W. For example, when the light source 110 includes a first sub-light source and a second sub-light source, and a first substrate and a second substrate are successively loaded in a transfer chamber, the first sub-light source may irradiate the incident light L1 having a first incident angle to the first substrate. The second sub-light source may irradiate the incident light L1 having a second incident angle to the second substrate. The second incident angle of the second sub-light source may be controlled based on a defect position of the first substrate and the first incident angle of the first sub-light source. Irradiation times of the incident lights L1 by the first sub-light source and the second sub-light source may be substantially the same or different from each other. For example, the irradiation time of the incident light L1 to the second substrate may be controlled based on the defect of the first substrate.

The optical detector 130 may collect the reflected light L2 from the substrate W. For example, the optical detector 130 may include a detection element such as a charge coupled device (CCD), a CMOS image sensor (CIS), a photomultiplier tube, an avalanche detector, a photodiode detector, a strak camera, a silicon detector, an area scan camera, a line scan camera, etc. The CIS may include a time delay integration (TDI) pixel array and a region detection CCD pixel array. The area scan camera may detect a colored defect or a defect of a colored substrate. The line scan camera may detect several micrometers of defects. The line scan camera may collect the reflected light L2 by a TDI scanning. The line scan camera may be referred to as a TDI camera. The TDI camera may photograph the inspection region of the substrate W several times. The TDI camera may overlap information of captured images with each other to generate an overlap signal. For example, the TDI camera may successively photograph from an initial photograph point to a last photograph point of the substrate W transferred at a constant speed. The TDI camera may accumulate collected signals by the photographing to collect the image information having a high resolution, thereby detect nanometers of the defect. The TDI camera may include at least one optical element such as a lens.

In example embodiments, the optical detector 130 may include a plurality of image sensors, a TDI camera and an area scan camera.

Further, the optical detector 130 may be configured to generate an electrical signal corresponding to the reflected light L2 based on an intensity of the reflected light L2 using the image sensors or the TDI camera. The optical detector 130 may receive the reflected light L2 from the transferred substrate W as an optical signal. The optical detector 130 may convert the analog signal into an electrical signal.

The optical detector 130 may successively receive the reflected lights L2 from the successively transferred substrates W. The optical detector 130 may generate electrical signals with respect to the reflected lights L2 from the substrates W. The optical detector 130 may then transmit the electrical signals to the defect inspection module 200.

The optical detector 130 may be placed at a position spaced apart from the surface of the substrate W. The optical detector 130 may be fixed to a specific position. Alternatively, the optical detector 130 may be moved along the transferring direction of the substrate W.

The optical detector 130 may include a plurality of detection elements for successively receiving the reflected lights L2 from the substrates W. The optical detector 130 may output a detection signal having a binary code based on the reflected light L2.

The optical path changer 150 may be arranged between the optical detector 130 and the substrate W. The optical path changer 150 may change an optical path of the reflected light L2. The optical path changer 150 may change the optical path so that the reflected lights L2 traveling in various directions are focused on the optical detector 130. For example, the optical path changer 150 may reflect or refract the reflected lights L2 having various diagonal directions with respect to the surface of the substrate W toward the optical detector 130. The optical path changer 150 may include a prism. In FIG. 2, a reference numeral "A" may indicate an average inclined angle between the incident light L1 and the reflected light L2. When the inclined angle A may be about 45° to about 135°, the intensity of the reflected light L2 may be a maximum value. The inclined angle A may be corrected by the optical path changer 150.

Figure 3:
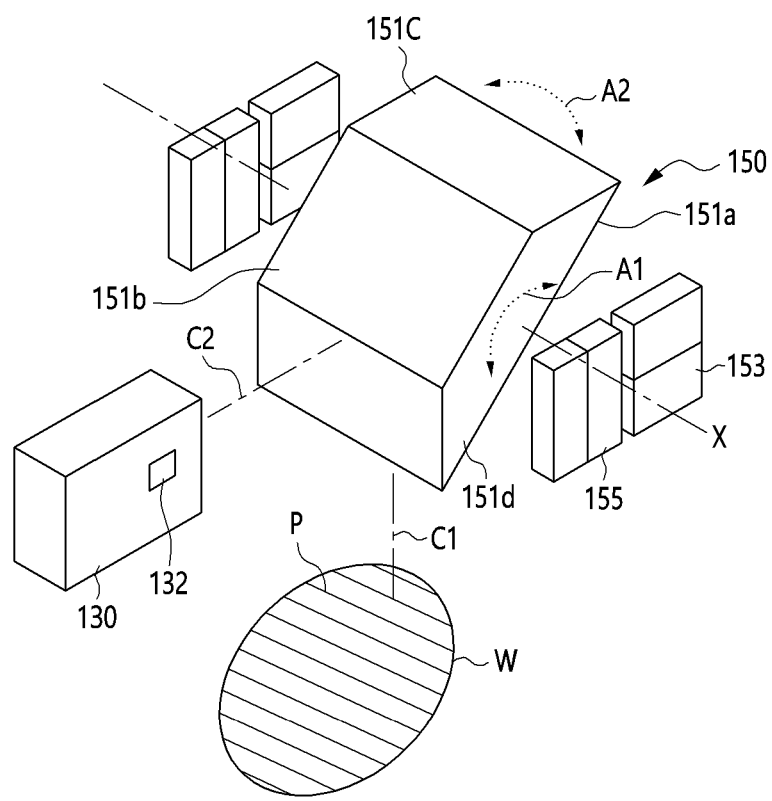
FIGS. 3 and 4 are views illustrating an operation of an optical path changer in accordance with example embodiments.
Figure 4:
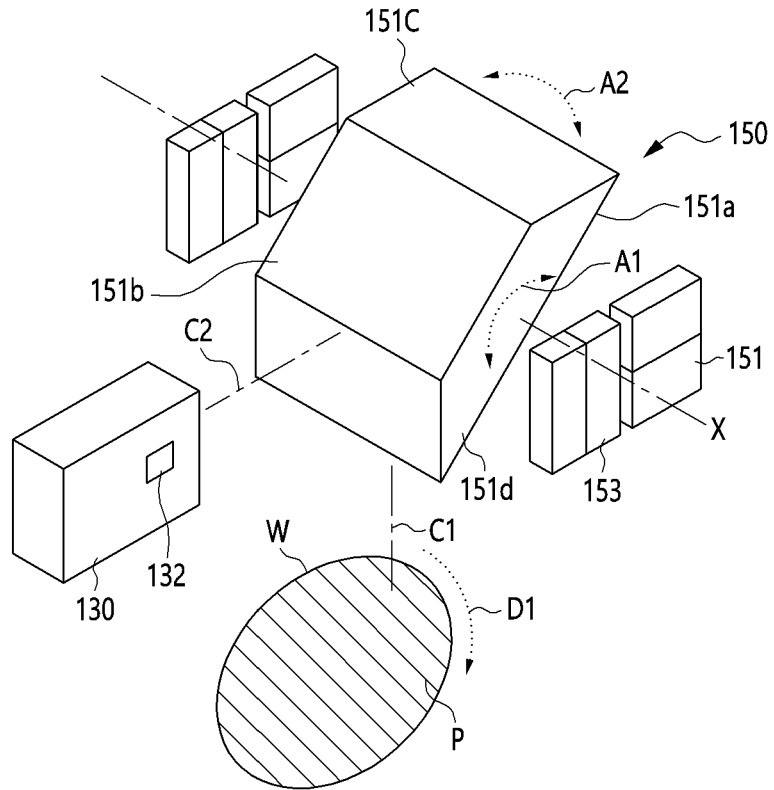

FIGS. 3 and 4 are views illustrating an operation of an optical path changer in accordance with example embodiments.

Referring to FIG. 3, the optical path changer 150 may include a plurality of optical surfaces 151a to 151d. For example, the optical path changer 150 may include an incidence surface 151a, an exit surface 151b, a reflection surface 151c and a side surface 151d configured to contact the incidence surface 151a, the exist surface 151b and the reflection surface 151c. The optical path changer 150 may control the inclined angle A by changing positions of the incidence surface 151a, the exit surface 151b, the reflection surface 151c and the side surface 151d.

The incidence surface 151a, the exit surface 151b and the reflection surface 151c may have quadrangular shapes having different sizes. A light exiting from the optical path changer 150 may be progressed in a direction substantially perpendicular to a surface of the exit surface 151b.

When the incident angle of the incident light L1 to the substrate W is about 45° to about 60°, the position of the optical path changer 150 may be adjusted to provide the inclined angle A between a normal line C1, which may be substantially perpendicular to an incidence surface of the incident light L1 and the surface of the substrate W, and a progressing direction C2 of the exiting light with about 75° to about 135°, thereby effectively concentrating the reflected light L2 on the optical detector 130.

When the incident angle of the incident light L1 to the substrate W is about 35° to about 55°, the position of the optical path changer 150 may be adjusted to provide the inclined angle A between the normal line C1 and the progressing direction C2 of the exiting light with about 45° to about 105°.

The optical detector 130 may further include an intensity measurer 132 for measuring intensity of the reflected light L2. The intensity measurer 132 may detect a maximum section of the intensity of the reflected light L2.

The control module 400 may receive the information of the incident light L1 provided from the light source 110 and the information of the maximum intensity of the reflected light L2 provided from the intensity measurer 132 in the optical detector 130. The control module 400 may control the position of the optical path changer 150 based on the information of the incident light L1 and the information of the maximum intensity of the reflected light L2.

The position change of the optical path changer 150, i.e., a rotation of the optical path changer 150 may be performed by a first driver 153 and a second driver 155. The first driver 153 and the second driver 155 may face each other with respect to the side surface 151d of the optical path changer 150. Each of the first driver 153 and the second driver 155 may include a north polar magnet and a south polar magnet. For example, the first driver 153 may include the north polar magnet and the south polar magnet which are sequentially stacked. The second driver 155 may include the north polar magnet and the south polar magnet arranged side by side. The optical path changer 150 may be rotated toward the A1 direction by driving at least one of the first driver 153 and the second driver 155.

A reference numeral "P" may indicate patterns on the substrate W. When the exit surface 151b of the optical path changer 150 is parallel to an extending direction of the patterns P, the information of the defect in the pattern P may be readily obtained.

As shown in FIGS. 3 and 4, the patterns P may be extended in one direction. Alternatively, the patterns P may be extended in various directions. Further, as shown in FIG. 4, the substrate W tilted in a direction D1 may be transferred. When the patterns P may be extended in the various directions or the tilted substrate W may be transferred, the position of the exit surface 151b may be controlled in accordance with a tilted angle of the substrate W, an extending direction of an uppermost patterns, or extending directions of the patterns. In this case, the first and second drivers 153 and 155 may be simultaneously driven to change the position of the optical path changer 150 toward the A1 direction and the A2 direction. The first and second drivers 153 and 155 may be driven based on a control signal provided from the control module 400. The control signal may be inputted into the first and second drivers 153 and 155 through the interface 180.

The optical information of the substrate W collected by the information-obtaining module 100 may be transmitted to the defect inspection module 200 and the control module 400 through the interface 180. The interface 180 may be directly or indirectly connected between the information-obtaining module 100, the defect inspection module 200, the power supply module 300 and the control module 400 to transmit the signals between the modules.

The defect inspection module 200 may determine whether the defect may exist in the substrate W or not based on the optical information provided from the information-obtaining module 100.

The defect inspection module 200 may include an image generator 210, a storage 230 and a defect determining member 250. The defect inspection module 200 may further include a pre-processing member 270 and a display 290.

The image generator 210 may process the optical information transmitted through the interface 180 to generate the image signal. The image generator 210 may receive and amplify the electrical signal collected by the information-obtaining module 100, i.e., the digital signal to output the image signal of the substrate W. For example, the image signal may be generated based on electrical signals based on pixels of the CIS. The image generator 210 may be substantially the same as an image processing circuit of a general photoelectric device.

The storage 230 may store the image signal generated from the image generator 210 based on the optical information collected by the information-obtaining module 100. The storage 230 may store an image signal generated based on optical information of the substrate without a defect and the optical information.

Therefore, the storage 230 may provide the optical information and the image signal of the substrate W without the defect or the optical information and the image signal of the previously transferred substrate as a reference.

The storage 230 may include a computer readable medium. The computer readable medium may be any one of various non-transitory computer readable media. The storage 230 may transmit the stored information to a management server or a terminal of a manager. The non-transitory computer readable medium may be configured to semi-permanently store data. The non-transitory computer readable medium may be readable by a device. For example, the non-transitory computer readable medium may include a CD, a DVD, a hard disk, a blue-ray disk, a USB, a memory card, an ROM, etc.

The defect determining member 250 may compare the image signal with the reference to determine the defect of the substrate W. For example, the optical information and the image signal may be classified into pixel units of the optical detector 130. Thus, the defect determining member 250 may compare the image signal or the optical information classified by position of the pixels with the image signal or the optical information corresponding to the reference to determine the defect in a specific position of the substrate W. Further, the defect determining member 250 may consider other environmental factors, for example, illumination intensity besides the defect to output the defect detection signal.

The defect determining member 250 may determine the defect by the pixel using a line profile method. The line profile method may represent a characteristic of an image as a line. The line profile method may analyze an image entirely or a specific section of the image. The defect determining member 250 may analyze the line for representing the characteristics of the image to recognize an initial coordinate of the unit pixel, not limited thereto. The defect determining member 250 may detect various defects such as a contaminant, an impurity, a scratch, a crack, a chipping, a breakage, etc., based on intensity, a color, a size, luminance and brightness of the image signal. For example, when the defect may be detected under a condition that the incident angle θ of the incident light may be about 45° to about 60°, a distortion of the reflected light L2 may be more increased by providing the incident angle θ with about 35° to about 55°. In this case, the defect may be determined as a protrusive defect, for example, a contaminant. When a distortion may not be generated in the reflected light L2 although a difference between the reflected light L2 and the reference, this defect may be determined as a defect in the substrate, for example, a crack.

The defect detection signal generated from the defect determining member 250 may be transmitted to the control module 400. The control module 400 may determine the kinds and positions of the defects. The control module 400 may determine a following process of the substrate W and a following inspection condition of the following substrate W, for example, driving conditions of the light source 110, the optical detector 130 and the optical path changer 150.

The pre-processing member 270 may correct distorted information of the image signals of the reference and the substrate W, for example, noises having no influence on the defect detection to analyze the defect more accurately. The pre-processing member 270 may match the scanning direction of the substrate W with the scanning direction of the reference to coincide the scanning directions of the substrate W and the reference with each other.

The display 290 may display defect detection results in accordance with the defect detection signal. The defect detection results may be outputted through a user interface (UI) or a graphic user interface (GUI).

The power supply module 300 may provide power to the modules 100, 180, 200 and 400 in the system 10.

The control module 400 may control the modules 100, 180, 200 and 300 in the system 10. For example, the control module 400 may receive a defect detection signal from the defect detection module 200 to determine the position, the size and the kind of the defect. The control module 400 may then generate the defect detection result based on the determined results. The control module 400 may then transmit the defect detection result to the display 290. The defect detection result may include a rework or a scrapping of the substrate W as well as the defect information. Thus, performing the following process with respect to the substrate W may be determined based on the defect detection result.

Further, in order to accurately determine whether a defect generated in a previous substrate W may be generated in the following substrate W or not based on the defect detection result, the control module 400 may control the operation conditions of the light source 110, the optical detector 130 and the optical path changer 150.

The control module 400 may include a micro-processor. The control module 400 may be connected with the modules through a wire communication or a wireless communication. The control module 400 may further generate a fault detection collection (FDC) interlock signal based on the defect detection result. Thus, when a serious defect may be generated in the substrate W, the following process may not be performed on the substrate W so that an interlock may be performed.

Figure 5:
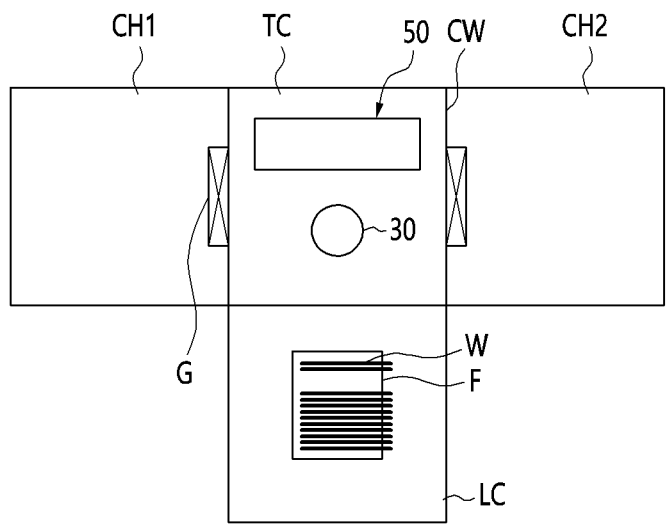
FIG. 5 is a block diagram illustrating a semiconductor fabrication apparatus in accordance with example embodiments.
Figure 6:
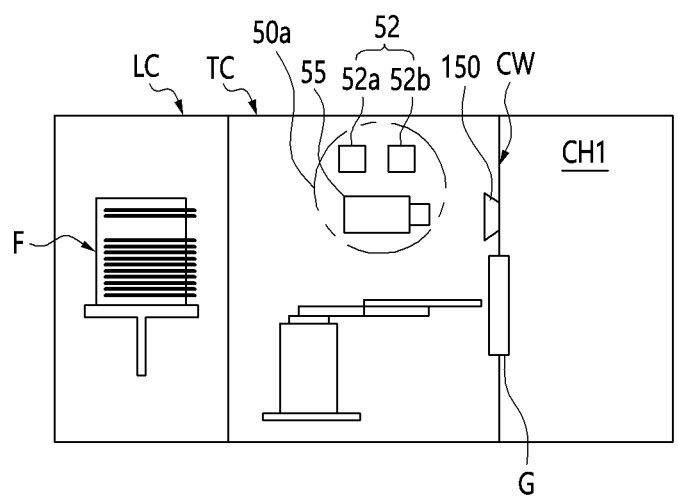
FIG. 6 is a side view illustrating a semiconductor fabrication apparatus in accordance with example embodiments.

FIG. 5 is a block diagram illustrating a semiconductor fabrication apparatus in accordance with example embodiments and FIG. 6 is a side view illustrating a semiconductor fabrication apparatus in accordance with example embodiments.

Referring to FIGS. 5 and 6, a semiconductor fabrication apparatus 20 may include a first process chamber CH1, a second process chamber CH2, a transfer chamber TC, a load-lock chamber LC and a defect inspection apparatus 50a.

The first process chamber CH1 and the second process chamber CH2 may perform a same process or different processes.

The load-lock chamber LC may be configured to receive a plurality of substrates W to be processed or processed substrates W. The substrates W may be received in a front opening unified pod (FOUP) F.

The transfer chamber TC may be arranged between the first process chamber CH1, the second process chamber CH2 and the load-lock chamber LC. The transfer chamber TC may include at least one transferring member 30 such as a robot arm, a conveyor belt, etc. For example, the transferring member 30 may sequentially transfer the substrate W on which a first process may be performed in the first process chamber CH1 or a second process may be performed in the second process chamber CH2 to the FOUP F in the load-lock chamber LC. The transferring member 30 may transfer the semiconductor substrate W in the FOUP F of the load-lock chamber LC to the first process chamber CH1 or the second process chamber CH2. A chamber wall CW may be arranged between the transfer chamber TC and the first process chamber CH1 and between the transfer chamber TC and the second process chamber CH2. A gate G may be arranged at the chamber wall CW. The substrate W may be transferred through the gate G.

The defect inspection apparatus 50a may be arranged in the transfer chamber TC. The defect inspection apparatus 50a may include the parts of the defect inspection system 10 in FIG. 1. The defect inspection apparatus 50a may be spaced apart from the surface of the substrate W which is inside the transfer chamber TC. In order to line scan all the surface of the transferred substrate W, the defect inspection apparatus 50a may be positioned at a front of and/or above the transferred substrate W.

The defect inspection apparatus 50a may include a successive photographer 55. The successive photographer 55 may successively photograph the substrate W in a line shape. The successive photographer 55 may accumulate photographed signals to output a successive image signal. The successive photographer 55 may include the configurations of the optical detector 130 and the image signal generator 210 in FIG. 1. The successive photographer 55 may include the TDI camera. Additionally, at least one optical lens may be provided to a front of the TDI camera. The defect inspection apparatus 50a may further include an illuminator 52 for outputting the image signal having the high resolution from the successive photographer 55. The illuminator 52 may correspond to the light source 110 in FIG. 1. The illuminator 52 may provide the photograph region of the successive photographer 55 with an illumination light to improve focusing characteristics of the successive photographer 55. The illuminator 52 may control an incident angle of the illumination light. The illuminator 52 may include a plurality of sub-light sources 52a and 52b. At least one of an incident angle, an intensity of illumination and a wavelength of the sub-light sources 52a and 52b may be different from each other. The sub-light sources 52a and 52b may be selectively turned-on. Flickering times (on/off operation times) of the sub-light sources 52a and 52b may be different from each other.

Figure 7A:
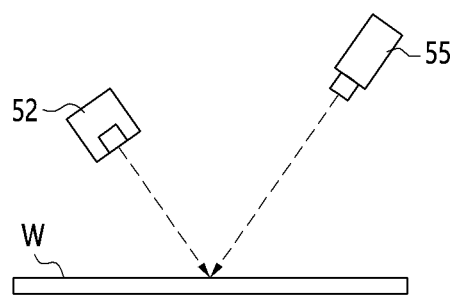
FIGS. 7A and 7B are views illustrating a defect inspection apparatus in accordance with example embodiments.
Figure 7B:
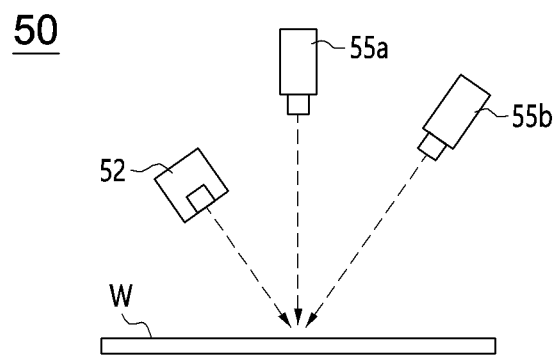

FIGS. 7A and 7B are views illustrating a defect inspection apparatus in accordance with example embodiments.

Referring to FIG. 7A, the successive photographer 55 and the illuminator 52 of the defect inspection apparatus 50 may be in a slant orientation relative to the surface of the substrate W. The successive photographer 55 may be movably arranged to photograph various regions of the substrate W.

Referring to FIG. 7B, the defect inspection apparatus 50 may include a first successive photographer 55a, a second successive photographer 55b and an illuminator 52. The first successive photographer 55a may be substantially perpendicular to the surface of the substrate W. The second successive photographer 55b may be slant to the surface of the substrate W. Thus, the first and second successive photographers 55a and 55b may be placed at different positions to photograph different regions of the substrate W.

Therefore, the various side surface of the substrate W may be photographed by changing the positions of the successive photographers 55, 55a and 55b to detect the defects having various shapes.

Referring again to FIG. 6, the defect inspection apparatus 50a may further include the optical path changer 150 configured to change the optical path of the reflected light from the substrate W, thereby concentrating the reflected light on the successive photographer 55. The optical path changer 150 may have a configuration substantially the same as the configuration of the optical path changer 150 in FIG. 1.

Figure 8:
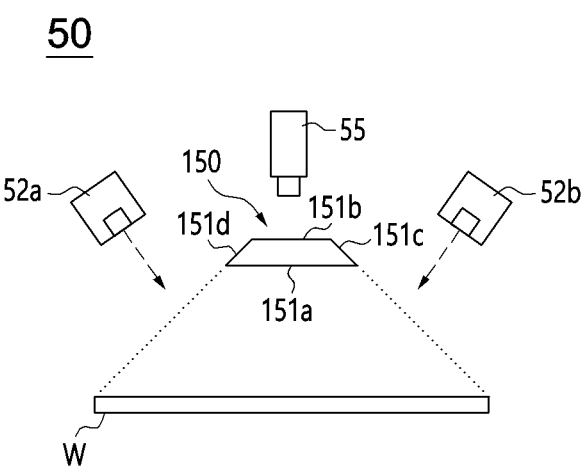
FIG. 8 is a view illustrating a defect inspection apparatus in accordance with example embodiments.

FIG. 8 is a view illustrating a defect inspection apparatus in accordance with example embodiments.

Referring to FIG. 8, the successive photographer 55 may face the exit surface 151b of the optical path changer 150. The first sub-light source 52a may be arranged at the first side surface 151d of the optical path changer 150. The second sub-light source 52b may be arranged at the second side surface 151d of the optical path changer 150. Thus, the sub-light sources 52a and 52b may be located at different positions with respect to the substrate W. The sub-light sources 52a and 52b may be simultaneously turned-on to improve the resolution of the successive photographer 55.

The storage 230 and the defect determining member 250 of the defect inspection module 200 in FIG. 1 may be provided to the control module 400. Thus, the control module 400 with the storage 230 and the defect determining member 250 may compare the image signal received from the successive photographer 55 with the image signal of the reference in the storage 230 to generate the defect detection signal.

Figure 9:
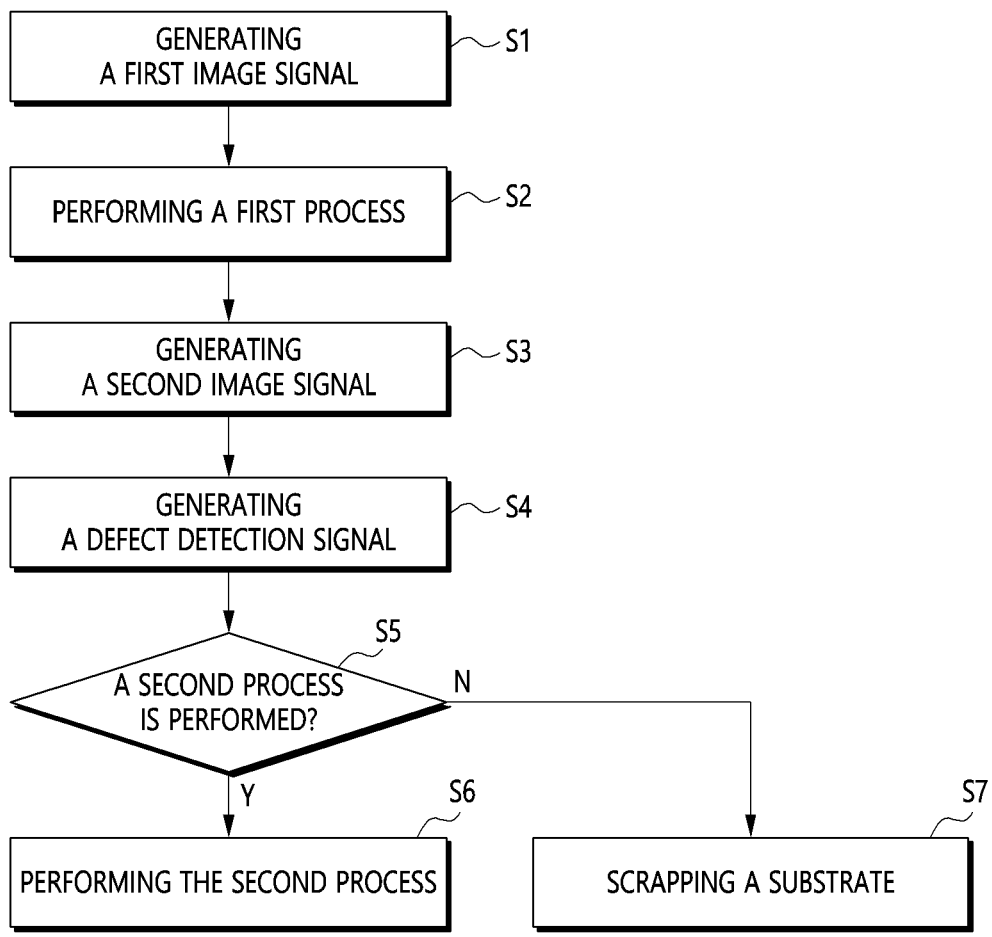
FIG. 9 is a view illustrating a method of inspecting a defect in accordance with example embodiments.

FIG. 9 is a view illustrating a method of inspecting a defect in accordance with example embodiments.

Referring to FIG. 9, in operation S1, a first image signal of the surface of the substrate W may be generated. The first image signal may be generated in the transfer chamber TC during the time when the substrate W may be transferred from the load-lock chamber LC to the first process chamber CH1. The first image signal may be an image signal before the substrate W may be processed. The first image signal may be generated by the operations of the information-obtaining module 100 and the defect inspection module 200 in FIG. 1. Further, the first image signal may be generated by the defect inspection apparatus 50a in FIG. 6.

In operation S2, the first process may be performed on the substrate W. The first process may be performed in the first process chamber CH1.

In operation S3, a second image signal of the substrate W on which the first process may be performed may be generated. The second image signal may be generated by the information-obtaining module 100 and the defect inspection module 200 in the transfer chamber TC or by the defect inspection apparatus 50a in FIG. 6.

In operation S4, the defect detection signal may be generated based on the second image signal. The defect detection signal may be generated from the defect inspection module 200 or the control module 400 including the defect determining member 250. The defect detection signal may be compared with the first and second image signals. When a difference between the signals may be beyond a critical range, the defect detection signal may be outputted. Further, the defect detection signal may be compared with the reference image signal and the second image signal. When a difference between the signals may be beyond a critical range, the defect detection signal may be outputted.

In operation S5, whether the second process may be performed or not may be determined based on the defect detection signal.

When the defect can be repaired based on the defect detection signal, in operation S6, the second process may be performed on the substrate W. In contrast, when the defect cannot be repaired based on the defect detection signal, in operation S7, the substrate W may be scrapped.

When a repair process may be performed before the second process, the defect inspection process may be performed between the repair process and the second process.

A critical condition, i.e., a defect determination index for determining performing the second process, performing the repair process or scrapping the substrate W may include numbers, sizes, kinds, etc., of the defect. The distortion caused by the defect may be measured by a mean square error (MSE) between the reference image signal and the inspection image signal.

The numbers of the defect may be numbers of independently detected defects. A defect in at least one pixel caused by a single reason may be set as one. The size of the defect may be based on numbers of the pixel with the defect. The kinds of the defect may be determined from the shape of the distorted reflected light.

According to example embodiments, the defect inspection method may be performed during the transfer of the substrate. Thus, it may not be required to perform an additional inspection process. Further, the defect inspection method may be performed with respect to all the semiconductor fabrication processes. Therefore, a time for manufacturing the semiconductor device may be remarkably reduced. Further, the defect may be checked in real time after the unit process. As a result, a rapid correspondence with respect to the defect may be performed by each of the processes.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A defect inspection system comprising:
an information-obtainer arranged over a transferring member to successively photograph a surface of at least one substrate moving between at least two apparatuses; and
a defect inspector generating an image signal based on information of the substrate provided from the information-obtainer and comparing the image signal with a reference to detect a defect of the substrate,
wherein the information-obtainer comprises:
a light source configured to provide the substrate with an incident light; and
an optical detector collecting a reflected light from the substrate to generate an electrical signal with respect to the reflected light, wherein the optical detector is configured to move along a transferring direction of the substrate, and
wherein the light source comprises a first sub-light source configured to irradiate a first light to a first substrate, which transfers first, and a second sub-light source configured to irradiate a second light to a second substrate, which transfers later.

2. The defect inspection system of claim 1, wherein the information-obtainer further comprises an optical path changer arranged between the substrate and the optical detector to change an optical path of the reflected light, thereby concentrating the reflected light on the optical detector.

3. The defect inspection system of claim 2, wherein the optical path changer comprises a prism.

4. The defect inspection system of claim 3, wherein the prism comprises an incidence surface and an exit surface, and a position of the exit surface is changed to control an inclined angle between the incident light and the reflected light.

5. The defect inspection system of claim 1, wherein the light source is configured to control an incident angle of the incident light based on a position of the defect on the substrate.

6. The defect inspection system of claim 1, wherein at least one of wavelengths, incident angles and lighting times of the first and second sub-light sources are different from each other.

7. The defect inspection system of claim 1, wherein the optical detector comprises at least one of a CMOS image sensor (CIS), a line scan camera and an area scan camera.

8. The defect inspection system of claim 7, wherein the line scan camera comprises a time delay integration (TDI) camera configured to photograph several times at least one portion of the substrate by a scanning and to overlap photographed images with each other to generate an image signal.

9. The defect inspection system of claim 1, wherein the defect inspector comprises:
an image signal generator configured to generate the image signal based on the information of the substrate provided from the information-obtainer;
a storage configured to store information of a normal substrate and information of a defect in a previous substrate as the reference; and
a defect determining member comparing the image signal with the reference to generate a defect detection signal.

10. A semiconductor fabrication apparatus comprising:
first and second process chambers;
a load-lock chamber configured to receive a plurality of substrates to be loaded into the first process chamber or the second process chamber;
a transfer chamber arranged between the first process chamber, the second process chamber and the load-lock chamber to successively transfer the substrates to the first process chamber, the second process chamber or the load-lock chamber; and
a defect inspector arranged in the transfer chamber to detect a defect of the substrates based on image signals of the substrates being transferred in the transfer chamber, the defect inspector configured to move along a transferring direction of the substrates, the defect inspector including an illuminator configured to provide an illumination light, wherein the illuminator comprises a first sub-light source configured to irradiate a first light to a first substrate, which enters into the transfer chamber first, and a second sub-light source configured to irradiate a second light to a second substrate, which enters into the transfer chamber subsequent to the first substrate.

11. The semiconductor fabrication apparatus of claim 10, wherein the defect inspector comprises at least one successive photographer successively photographing at least one portion of the substrate and accumulating the photographed signals to output a successive image signal.

12. The semiconductor fabrication apparatus of claim 11, wherein the successive photographer is inclined relative to the surface of the substrate.

13. The semiconductor fabrication apparatus of claim 11, wherein the illuminator is configured to provide the successive photographer with the illumination light.

14. The semiconductor fabrication apparatus of claim 13, wherein at least one of incident angles, illuminations and wavelengths of the illumination light from the first and second sub-light sources are different from each other.

15. The semiconductor fabrication apparatus of claim 14, wherein the first and second sub-light sources are located at different positions to simultaneously provide the substrate with the illumination light.

16. The semiconductor fabrication apparatus of claim 11, wherein the defect inspector further comprises an optical path changer changing an optical path of a light exiting from the substrate to concentrate the light on the successive photographer.

17. A semiconductor fabrication apparatus comprising:
a first process chamber, a second process chamber, a load-lock chamber, and a transfer chamber,
wherein the transfer chamber includes a transferring member for transferring a substrate between the first process chamber, the second process chamber and the load-lock chamber, and a defect inspector configured to detect a defect of the substrate,
wherein at least one part of the defect inspector is configured to move along a transferring direction of the substrate being transferred in the transfer chamber, and
wherein the defect inspector includes a light source having a first sub-light source configured to irradiate a first light to a first substrate, which transfers first, and a second sub-light source configured to irradiate a second light to a second substrate, which transfers later.

* * * * *